US012681378B2

(12) United States Patent
Shin et al.

(10) Patent No.: US 12,681,378 B2
(45) Date of Patent: Jul. 14, 2026

(54) MASK PROCESS CORRECTION METHODS AND METHODS OF FABRICATING LITHOGRAPHIC MASKS USING THE SAME

(71) Applicant: Samsung Electronics Co., Ltd., Suwon-si (KR)

(72) Inventors: Soeun Shin, Hwaseong-si (KR); Minah Kim, Hwaseong-si (KR); Jin Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 605 days.

(21) Appl. No.: 17/826,796

(22) Filed: May 27, 2022

(65) Prior Publication Data

US 2023/0074316 A1 Mar. 9, 2023

(30) Foreign Application Priority Data

Sep. 6, 2021 (KR) ........................ 10-2021-0118545

(51) Int. Cl.
*G03F 1/36* (2012.01)
*G03F 1/70* (2012.01)
(Continued)

(52) U.S. Cl.
CPC .................. *G03F 1/36* (2013.01); *G03F 1/70* (2013.01); *G03F 1/78* (2013.01); *G03F 1/86* (2013.01); *G03F 7/70441* (2013.01)

(58) Field of Classification Search
CPC ..... G03F 1/26; G03F 1/70; G03F 1/78; G03F 1/86; G03F 7/70441
(Continued)

(56) References Cited

U.S. PATENT DOCUMENTS

| | | | |
|---|---|---|---|
| 10,025,175 | B2 | 7/2018 | Tsai et al. |
| 10,223,494 | B2 | 3/2019 | Shin et al. |

(Continued)

FOREIGN PATENT DOCUMENTS

| | | | | | |
|---|---|---|---|---|---|
| GB | 2163561 | A | * | 2/1986 | ............... G03F 1/00 |
| JP | 62200727 | A | * | 9/1987 | |

(Continued)

OTHER PUBLICATIONS

Zho et al., "Using Curvature-based Pre-bias to Reduce No. of Iterations in Curvilinear Mask Process Correction", PRoc SPIE vol. 11855, article 118550Q ((7 pages) (2021).*
(Continued)

*Primary Examiner* — Martin J Angebranndt
(74) *Attorney, Agent, or Firm* — Wolf, Greenfield & Sacks, P.C.

(57) ABSTRACT

Methods of fabricating lithographic masks include performing mask process correction (MPC) on a mask tape out (MTO) design layout. Performing MPC may include identifying a plurality of unit cells (each being iterated in the MTO design layout and including a plurality of curve patterns), and performing model-based MPC on at least one of the plurality of unit cells. These methods may further include performing electron beam exposure based on the MTO design layout on which the MPC is performed. The performing model-based MPC on at least one of the plurality of unit cells may be based on at least one of an aspect ratio, sizes, curvatures of curved edges, density, and a duty of the plurality of curve patterns.

13 Claims, 9 Drawing Sheets

(51) Int. Cl.
　　 *G03F 1/78* 　　　　 (2012.01)
　　 *G03F 1/86* 　　　　 (2012.01)
　　 *G03F 7/00* 　　　　 (2006.01)

(58) Field of Classification Search
　　 USPC .......................................................... 430/5
　　 See application file for complete search history.

(56) References Cited

U.S. PATENT DOCUMENTS

| | | | |
|---|---|---|---|
| 10,534,255 B2 | 1/2020 | Quaglio et al. | |
| 10,657,213 B2 | 5/2020 | Ungar | |
| 10,877,380 B1 | 12/2020 | Lin et al. | |
| 10,962,874 B2 * | 3/2021 | Misaka | G03F 1/36 |
| 11,169,437 B2 * | 11/2021 | Yeo | G03F 1/36 |
| 11,176,307 B2 | 11/2021 | Vellanki et al. | |
| 2007/0061773 A1 * | 3/2007 | Ye | G03F 7/705 |
| | | | 700/121 |
| 2009/0004576 A1 * | 1/2009 | Furukawa | G03F 7/70641 |
| | | | 430/5 |
| 2010/0218156 A1 * | 8/2010 | Pierrat | G03F 1/36 |
| | | | 716/139 |
| 2012/0128228 A1 | 5/2012 | Fujimura et al. | |
| 2013/0311958 A1 | 11/2013 | Liu | |
| 2016/0363853 A1 * | 12/2016 | Ning | G03F 1/36 |
| 2017/0115556 A1 * | 4/2017 | Shim | G03F 1/36 |
| 2017/0123327 A1 | 5/2017 | Jang et al. | |
| 2018/0269247 A1 * | 9/2018 | Kumai | H10F 99/00 |
| 2019/0354005 A1 * | 11/2019 | Lan | G03F 1/36 |
| 2020/0103764 A1 * | 4/2020 | Tien | G06F 30/3308 |
| 2020/0380089 A1 | 12/2020 | Gheith et al. | |
| 2022/0107568 A1 * | 4/2022 | Johnson | G02B 27/4222 |

FOREIGN PATENT DOCUMENTS

| | | | | | |
|---|---|---|---|---|---|
| JP | 0696214 | A | * | 4/1994 | |
| JP | 2004055898 | A | * | 2/2004 | |
| JP | 2017044721 | A | * | 3/2017 | G03F 7/20 |
| KR | 20080076352 | A | * | 8/2008 | A23L 7/10 |
| KR | 20170011554 | A | | 2/2017 | |
| KR | 20190087597 | A | | 7/2019 | |
| KR | 10-2020-0072981 | A | | 6/2020 | |
| KR | 20200091914 | A | | 7/2020 | |

OTHER PUBLICATIONS

Machine translation of JP 62-200727 (1987).*

Zuo et al. "Using curvature-based pre-bias to reduce No. of iterations in curvilinear mask process correction" Proc. SPIE 11855, Photomask Technology 2021, 118550Q (Oct. 12, 2021).

* cited by examiner

GENERATE DESIGN LAYOUT — P10

PERFORM OPC ON DESIGN LAYOUT — P20

INPUT DATA OF MTO DESIGN LAYOUT — P30

PREPARE MASK DATA — P40

ELECTRON BEAM EXPOSURE — P50

| | |
|---|---|
| IDENTIFY UNIT CELLS IN MTO DESIGN LAYOUT | P41 |
| PERFORM MODEL–BASED MPC FOR ANY ONE OF UNIT CELLS | P43 |
| APPLY BIAS CALCULATED IN MODEL– BASED MPC TO EACH OF UNIT CELLS | P45 |
| ACQUIRE BIASED CURVED EDGES BASED ON PLURALITY OF BIASED VERTICES AND CURVATURES OF CURVED EDGES OF PLURALITY OF CURVE PATTERNS | P47 |

MASK PROCESS CORRECTION METHODS AND METHODS OF FABRICATING LITHOGRAPHIC MASKS USING THE SAME

REFERENCE TO PRIORITY APPLICATION

This application claims priority under 35 U.S.C. § 119 to Korean Patent Application No. 10-2021-0118545, filed Sep. 6, 2021, the disclosure of which is hereby incorporated by reference herein.

BACKGROUND

The inventive concept relates to mask process correction (MPC) methods and a methods of fabricating lithographic masks using the same.

Photolithography in a semiconductor device fabrication process is a process of forming a circuit pattern previously formed in a lithographic mask by irradiating a photosensitive film applied on a substrate with, for example, a light beam(s). Recently, line widths between patterns of a circuit layout have been greatly reduced. To accommodate these reductions, the importance of exposure to extreme ultraviolet (EUV) light and electron beams has increased. In addition, in a process of fabricating a lithographic mask, there may be errors due to an optical interference effect between adjacent patterns of the lithographic mask, and optical and chemical systematic errors. Accordingly, various methods of correcting the errors are being studied.

SUMMARY

The inventive concept provides a mask process correction (MPC) method that is computationally efficient to thereby increase the speed of MPC, and methods of fabricating lithographic masks using the same.

According to an aspect of the inventive concept, there is provided a method of fabricating a lithographic mask. The method includes performing mask process correction (MPC) on a mask tape out (MTO) design layout for fabricating the lithographic mask, and then fabricating the lithographic mask by performing electron beam exposure based on the MTO design layout on which the MPC is performed. In some of these embodiments, the performing of the MPC includes identifying a plurality of unit cells (each being iterated in the MTO design layout and including a plurality of curve patterns), and performing model-based MPC on any one of the plurality of unit cells.

According to another aspect of the inventive concept, there is provided a method of fabricating a lithographic mask. The method includes performing MPC on an MTO design layout, and then fabricating the lithographic mask by performing electron beam exposure based on the MTO design layout on which the MPC is performed. The performing of the MPC can include identifying a plurality of unit cells (each being iterated in the MTO design layout and including curve patterns, convex patterns, concave patterns, and linear patterns), and performing model-based MPC on any one of the plurality of unit cells.

According to another aspect of the inventive concept, there is provided a method of preparing mask data. The method includes identifying a plurality of unit cells, which are each iterated in an MTO design layout generated using inverse lithography technology (ILT), and include a plurality of curve patterns having elliptical curved edges. The method may also include performing model-based MPC for any one of the plurality of unit cells by using at least one of an aspect ratio, sizes, curvatures of the curved edges, density, and a duty of the plurality of curved patterns as factors.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
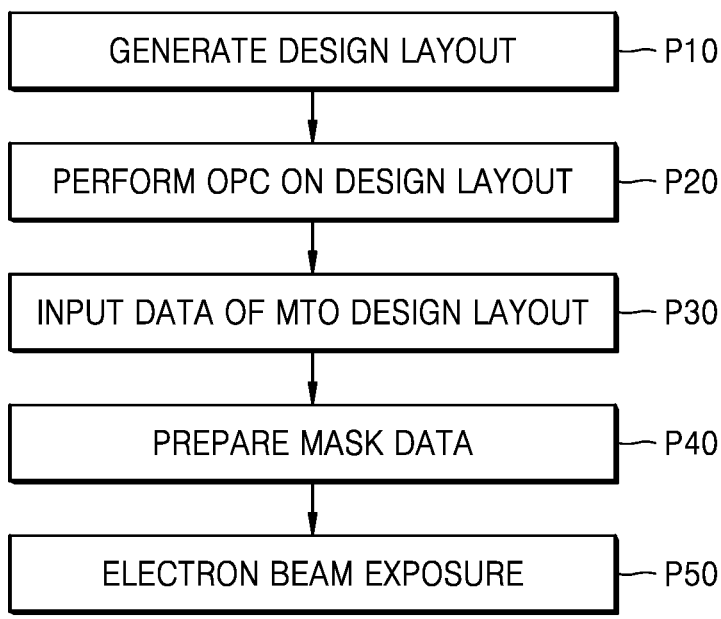
FIG. 1 is a flowchart illustrating a method of fabricating a lithographic mask, according to an embodiment.

Hereinafter, embodiments of the inventive concept are described in detail with reference to the accompanying drawings. The same reference numerals are used for the same components in the drawings, and redundant descriptions thereof are omitted.

FIG. 1 is a flowchart illustrating a method of fabricating a lithographic mask, according to an embodiment. Referring to FIG. 1, a design layout may be provided in operation P10. The design layout may include various geometric patterns for fabricating semiconductor devices. The patterns of the design layout may be composed of various geometric patterns including line patterns having a preset width and extending horizontally and curve patterns having curved edges. Various geometric patterns of the design layout may correspond to a metal pattern, an oxide pattern, a semiconductor pattern, or so on implemented on a substrate (e.g., semiconductor wafer) to manufacture various components of a semiconductor device. The components may include, for example, active regions, gate electrodes, vias of metal lines or interlayer interconnects, bonding pads, and so on. Components may be formed on a semiconductor substrate, or various material layers deposited on the semiconductor substrate.

The design layout may be stored as one or more data files including information on geometric patterns. For example, the design layout may be stored as any suitable data format readable by a computer, such as a graphic data system II (GDSII) data format, a Caltech intermediate form (CIF) data format, or an open artwork system interchange standard (OASIS) data format.

Optical proximity correction (OPC) may be performed in operation P20. As a size of a critical dimension of an integrated circuit is reduced and the density thereof is increased, a critical dimension of a circuit pattern or a physical design approaches a resolution limit of exposure equipment used in an optical lithography of the related art. An OPC process is developed to transfer patterns, onto a substrate, including features less than a wavelength of light used in an optical lithographic process.

As a pattern is miniaturized (e.g., micronized), an optical proximity effect (OPE) occurs due to influence between adjacent patterns during an exposure process of implementing the pattern. OPC is a method of reducing an OPE by correcting a pattern layout on a mask. The correction of the pattern layout may be performed by changing a position of a segment of an edge of a pattern, or by adding polygons to the pattern.

In more detail, OPC may be a process of changing a physical design (that is, a design layout) to compensate for distortions caused by effects such as optical diffraction and optical interaction of features by proximity features. The OPC includes all exposure resolution enhancement techniques performed when forming a reticle. The OPC is developed to transfer patterns with features less than a wavelength of light used in an optical lithographic process.

For example, the OPC may include adding sub-resolution lithography features to mask patterns to reduce a difference between an original design layout and a circuit pattern actually transferred onto a substrate, such as a silicon wafer. The sub-resolution lithographic features may compensate for proximity effects by interacting with patterns in a design layout, and thus, a circuit pattern transferred onto a substrate may be improved.

One example used to improve transfer of a pattern is a sub-resolution assist feature (SRAF). Another example in which transfer of a pattern is improved is called "serifs". The serifs are features that may be placed on inner or outer corners of a pattern to sharpen the corners of the pattern transferred onto a substrate. A degree of precision required for a process for SRAFs may be less than a degree of precision for design patterns intended to be printed on a substrate.

Inverse lithography technology (ILT) is a type of OPC technology. The ILT is a process in which a pattern formed on a reticle is calculated directly from a pattern intended to be formed on a substrate such as a silicon wafer. The ILT may include simulating an optical lithographic process in reverse by using a pattern to be implemented on a substrate as an input. Reticle patterns derived from the ILT may be composed of pure curved lines (that is, perfect non-straight lines) and may include circular patterns, substantially circular patterns, ring-shaped patterns, substantially annular patterns, elliptical patterns, and/or substantially elliptical patterns. Here, ILT, OPC, source mask optimization (SMO), and computational lithography are terms used interchangeably.

OPC may be repeatedly performed, and as the OPC is repeated, a pattern formed on a substrate by using a modified pattern may be closer to an initial design layout. The OPC may end based on a preset cost function or may end when the number of iterations reaches a target number.

In operation P30, data of a mask tape out (MTO) design layout may be transmitted to a mask fabricating team. According to example embodiments, the MTO design layout indicates a final result of a design process of an integrated circuit or a printed circuit board before being sent for tape-out in electronic and photonics designs. That is, the MTO design layout may indicate a design layout in which OPC is completed. According to some embodiments, data of the MTO design layout may have a graphic data format used in electronic design automation (EDA) software or so on. According to some embodiments, the data of the MTO design layout may have a data format such as GDS2, CIF, or OASIS.

Subsequently, mask data preparation (MDP) may be performed on data of the MTO design layout in operation P40. According to some embodiments, the MDP may include, for example, fracturing (i.e., format conversion), augmentation of barcodes for mechanical reading, standard mask patterns for inspection, job decks, and so on, and automatic and manual verification. The fracturing may indicate division of data of the MTO design layout for each region to convert the data to into a format for an electron beam exposure apparatus. According to some embodiments, the fracturing may improve quality of a final mask. The fracturing may be performed for correction of a mask process. The fracturing may include data manipulation such as scaling, rotation of data, pattern reflection, color inversion, and so on. And, according to some embodiments, the job-deck means generation of a text file related to a series of commands, such as arrangement information of multiple mask files, a reference dose, and an exposure speed or method.

The MDP may include mask rule check. The mask rule check is a process of checking whether the modified design layout complies with a mask fabrication rule in order to check that the design layout performed by MDP has a sufficient process margin to prevent defects due to tolerance. Here, the mask fabrication rule may include restrictions on certain geometric shapes (e.g., restrictions on patterns which are so complex that mask fabrication is impossible), restrictions on a space between patterns, dimensional restrictions and restrictions on connections, and so on.

According to some embodiments, the MDP may include mask process correction (MPC), which is a data correction process for systematic errors. The systematic errors may include errors generated during a series of processes of fabricating a lithographic mask, such as electron beam writing, development, etching, and baking Some aspects of MPC according to example embodiments are described in more detail with reference to FIGS. 2 to 5. After the MPC is performed, MPC verification may be further performed. The MPC verification is to check whether correction by a mask process model used for the MPC is correct. In one example, in the MPC verification, whether a pattern correction is partially omitted or the pattern is over-corrected may be checked by performing an XOR operation on mask data before and after MPC. In another example, in the MPC verification, the accuracy of the MPC may also be precisely verified by changing a shape of a mask pattern into a two-dimensional contour by using a mask process model, and by comparing the two-dimensional contour with a shape according to data before performing the MPC, that is, data of MTO design layout.

After the MPC verification is performed, it may be determined whether the accuracy of the MPC is within an acceptable range, and when the accuracy of the MPC is within the acceptable range, the MPC may be terminated. However, when the accuracy of the MPC is outside an acceptable range, the mask process model may be revised. The modification of the mask process model may include a change in recipe data of the mask process model.

According to some embodiments, data processing may be performed before the mask substrate is exposed. According to some embodiments, data processing is a kind of pre-processing for the mask data and may include grammar check for mask data, prediction of exposure time, and so on. According to some embodiments, the mask data may be converted into pixel data after the MDP is performed and before exposure is performed. The pixel data may include data directly used for actual exposure and may include data about a shape to be exposed and data about a dose assigned to each shape. According to some embodiments, the data about the shape to be exposed may include bit-map data in which shape data, which is vector data, is converted through rasterization or so on.

After the mask data is converted into pixel data, electron beam writing (that is, exposure) may be performed by using the pixel data, as shown by operation P50. Here, the electron beam writing may mean irradiating the mask substrate, that is, an original mask plate, with an electron beam, based on the pixel data. The original mask plate may include a substrate formed of a material such as glass or fused silica, and an opaque thin film that is formed of chromium on the substrate. After the opaque thin film is coated with a resist film with high etch-resistance, the resist film may be irradiated with an electron beam to transfer a mask pattern onto the resist film.

The electron beam writing may include, for example, either variable shape beam (VSB) exposure or gray exposure using a multi-beam mask writer (MBMW). After the electron beam writing, subsequent processes such as a development process, an etching process, and a cleaning process may be performed to manufacture a lithographic mask.

The development process is a process of removing resist, which is exposed (or unexposed) to the electron beam, on the mask substrate. Removing the portion exposed to the electron beam is called positive processing, and removing the portion unexposed to the electron beam is called negative processing. In the etching process after the development process, the thin film not covered by the resist film may be removed, and then the resist film may be removed. After the resist film is removed, the cleaning process may be performed.

The process of fabricating the lithographic mask may further include a measurement process, a defect inspection process, a defect repair process, and a pellicle application process. When it is confirmed that there are no contaminants or chemical stains through the measurement process and the defect inspection process, a pellicle for protecting the lithographic mask may be applied onto a surface of the mask.

Figure 2:
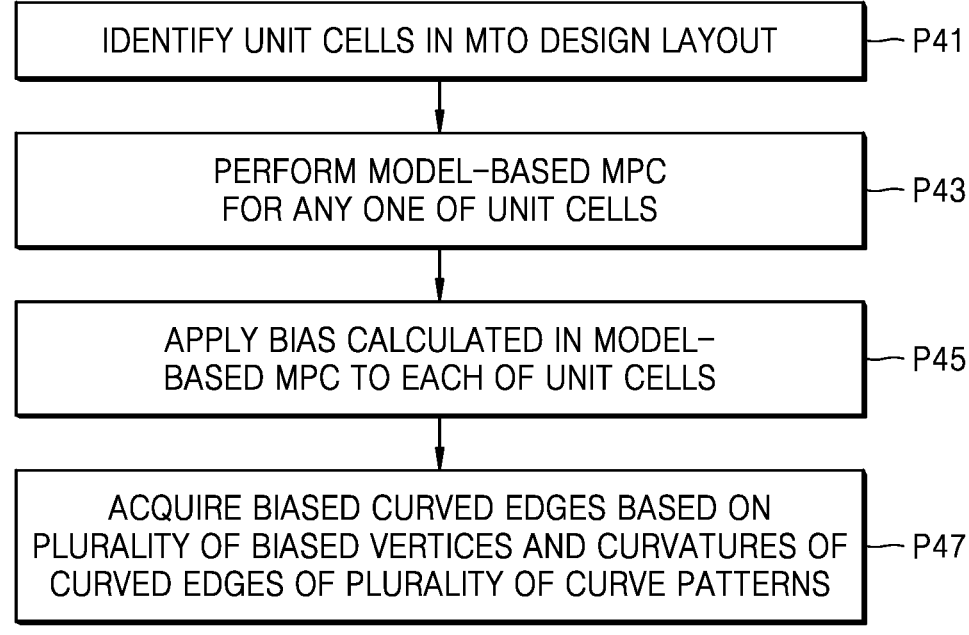
FIG. 2 is a flowchart illustrating mask process correction (MPC) according to an example embodiment.
Figure 3:
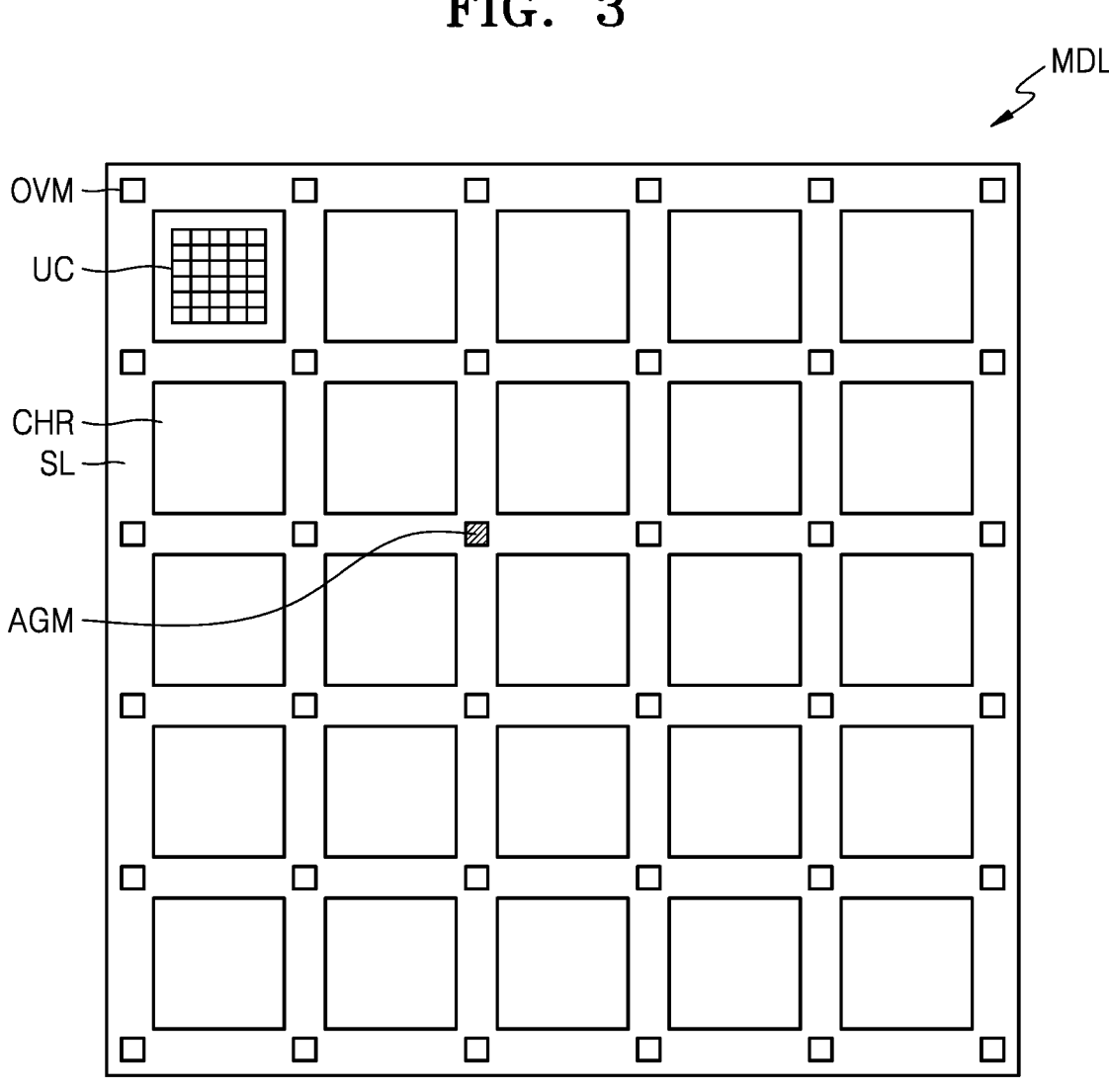
FIG. 3 is a plan view illustrating a mask tape out (MTO) design layout according to an example embodiment.
Figure 4:
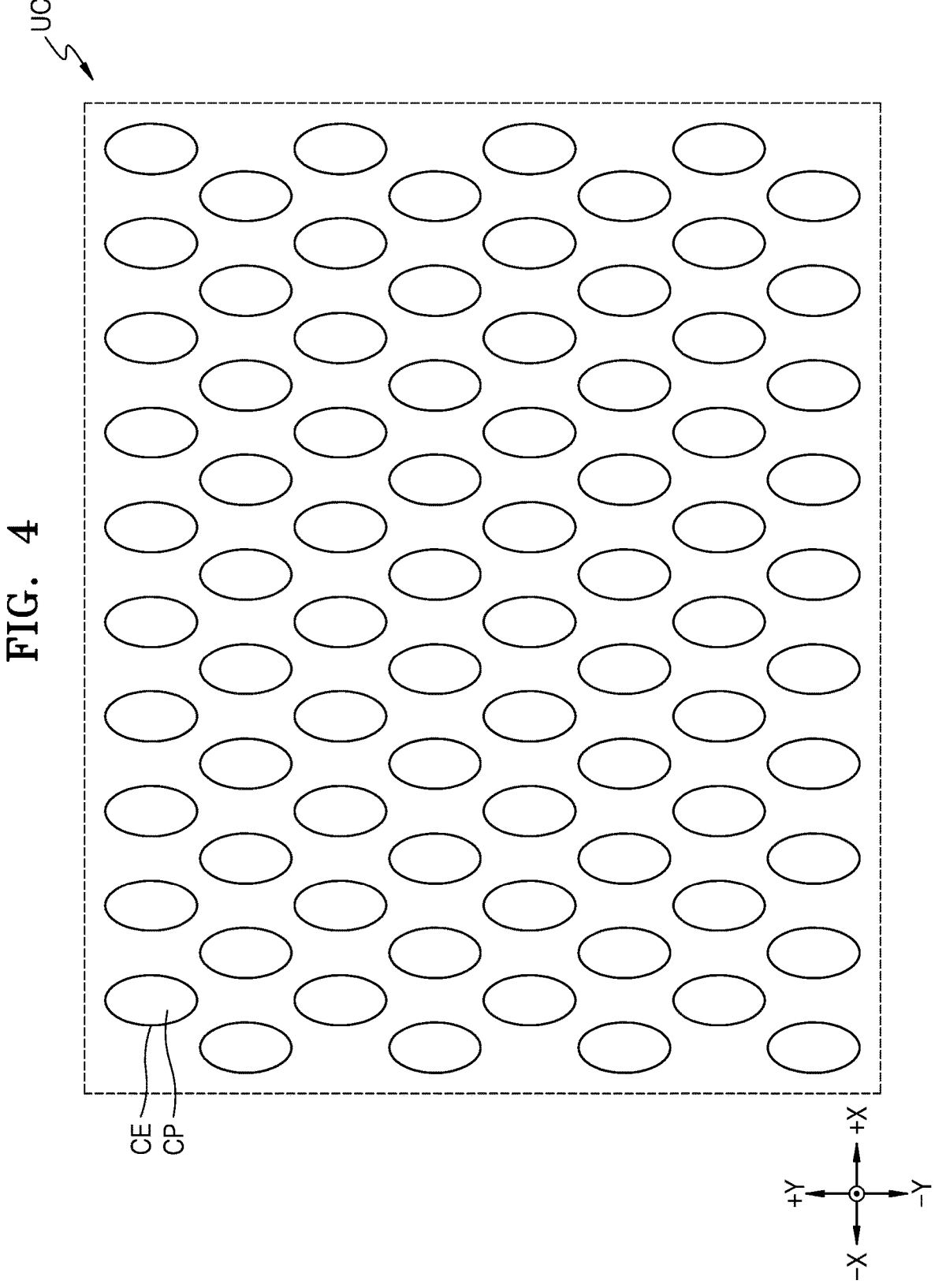
FIG. 4 is a partial plan view illustrating a unit cell illustrated in FIG. 2.

FIG. 2 is a flowchart illustrating MPC according to example embodiments. FIG. 3 is a plan view illustrating MTO design layout MDL according to example embodiments. FIG. 4 is a partial plan view illustrating a unit cell UC illustrated in FIG. 2. Referring to FIGS. 2 to 4, in operation P41, a plurality of unit cells UC in the MTO design layout MDL may be identified.

The MTO design layout MDL may correspond to the whole mask pattern that may be transferred through one scan. In general, an extreme ultraviolet (EUV) exposure process may proceed with a down-axis projection, for example, a 4:1 down-axis projection. Accordingly, patterns formed on a patterning device such as a mask pattern may be reduced to a quarter size and transferred to a wafer. Here, a quarter is a reduction ratio of a length and may correspond to about $\frac{1}{16}$ of an area. According to some embodiments, the MTO design layout MDL may have a size of about 26 mm in the x axis and about 33 mm in the y axis, but is not limited thereto.

The MTO design layout MDL may include scribe lanes SL between chip regions CHR. The scribe lanes SL may be between the chip regions CHR to isolate main chips from each other. The scribe lanes SL may be isolation regions for isolating integrated circuits formed in the chip regions CHR to be divided into individual semiconductor chips/dies in a sawing process.

According to some embodiments, the chip regions CHR may be used to form memory devices. The memory devices may include, for example, non-volatile memory devices. The memory devices may include non-volatile NAND-type flash memory devices. The memory devices may include phase change random access memory (PRAM), magnetic random access memory (MRAM), resistive random access memory (ReRAM), ferroelectric random access memory (FRAM), and NOR flash memory. In another example, the memory devices may include volatile memory devices such as dynamic random access memory (DRAM) and static random access memory (SRAM), which loses data when power is disconnected.

The chip regions CHR are illustrated as having an approximately square profile but are not limited thereto. For example, the chip regions CHR may be for fabricating driver integrated circuit (IC) chips; thus, one side of each of the driver IC chips may be longer than other sides perpendicular thereto.

According to some embodiments, an alignment mark AGM and overlay marks OVM may be further formed on a full shot FS. According to some embodiments, the alignment mark AGM and the overlay marks OVM are illustrated as being formed on the scribe lanes SL but are not limited thereto. For example, the alignment mark AGM and the overlay marks OVM may be formed in the chip regions CHR.

The alignment mark AGM may include a pattern used in lithography to accurately set an exposure region. According to some embodiments, the alignment mark AGM may be placed in a position adjacent to a central portion of the full shot FS but is not limited thereto. Referring to FIG. 4, one full shot FS is illustrated as including one alignment mark AGM but is not limited thereto. For example, two or more alignment marks AGM may be in the full shot FS. In addition, the alignment mark AGM may be omitted in the full shot FS.

According to some embodiments, the overlay marks OVM may form a pattern for measuring interlayer consistency between a layer formed in a previous process and a layer formed in a current process. Here, the interlayer consistency may include alignment of adjacent layers and whether a circuit defect occurs, for example, whether a circuit is short-circuited or opened. The overlay marks OVM may be placed at a higher density than alignment marks AGM. That is, the number of overlay marks OVM included in the MTO design layout MDL may be greater than the number of alignment marks AGM.

Marks having various functions may be additionally provided on the full shot FS. For example, a mark for testing characteristics of a completed semiconductor device, a mark for measuring a thickness of an uppermost layer after the CMP process, a mark for measuring a thickness of an outermost layer, a mark for measuring a critical dimension or an inner thickness by using an optical method, or so on may be additionally provided to the full shot FS.

Each of the chip regions CHP may include a plurality of unit cells UC. The plurality of unit cells UC may be substantially identical to each other. That is, the unit cells UC may be repeatedly placed in the chip regions CHR. The unit cells UC may occupy areas remaining in the chip regions CHR except a partial region in which a core-perimeter circuit is placed. In some embodiments, each of the unit cells UC may include a plurality of curve patterns CP. The plurality of curve patterns CP may be arranged to form rows and columns in the unit cells UC. The unit cells UC may be on a plane extending in the ±X direction and ±Y direction. Each of the plurality of curve patterns CP may have a curved edge CE. A planar shape of each of the plurality of curve patterns CP may be an ellipse or a circle. In addition, each of the plurality of curve patterns CP may include any one of lower electrodes of a DRAM device, openings of a support pattern for supporting the lower electrodes, channel holes for forming a channel structure of a vertical NAND flash memory, and via holes of contact holes of various integrated circuits, for example.

A size of each of the unit cells UC may be determined based on an area of a surrounding environment that is aware when MPC is performed. The size of each of the unit cells UC may be determined based on a range in which a systematic error that may occur in a lithographic mask fabrication process affects. For example, the size of each of the unit cells UC may be determined based on a size of a kernel when MPC is performed. Then, referring to FIGS. 2 and 4, model-based MPC may be performed for any one of the unit cells in P43.

The MPC may indicate correction of data for MTO design layout MDL including correction of a mask process model, adjustment of a line width, adjustment of a degree of precision of pattern arrangement, and so on. That is, the MPC may supplement OPC. For example, the MPC may reduce or remove a critical linewidth error occurring in a region with a high pattern density despite OPC being performed.

The MPC generally represents electron beam exposure by using an electron scattering model and represents development and etching process effects by using a process model. The models may be used to iteratively simulate a position of an edge of a layout feature and move each of segments of the edge to maximize positional accuracy of edges of features of a completed reticle. In order to simultaneously maximize the positional accuracy of each of the segments of the edge, an optional dose assignment may be used in conjunction with movement of each of the segments of the edge.

Factors for performing model-based MPC may include at least one of an aspect ratio, sizes, curvatures of curved edges CE, density, and a duty of the plurality of curve patterns CP. Here, the factors may be used for gauge data implementation to generate an empirical model. Here, the aspect ratio means a ratio of a major axis to a minor axis of the curve patterns CP, the size means a characteristic length (e.g., a length of the major axis or a length of the minor axis) of the curve patterns CP, the density means a ratio of areas of exposed portions in a certain region, and the duty means a ratio of an X-direction length and a Y-direction length occupied by a pattern within a pitch, which is a spatial period in which the curve patterns CP are iterated.

Figure 5:
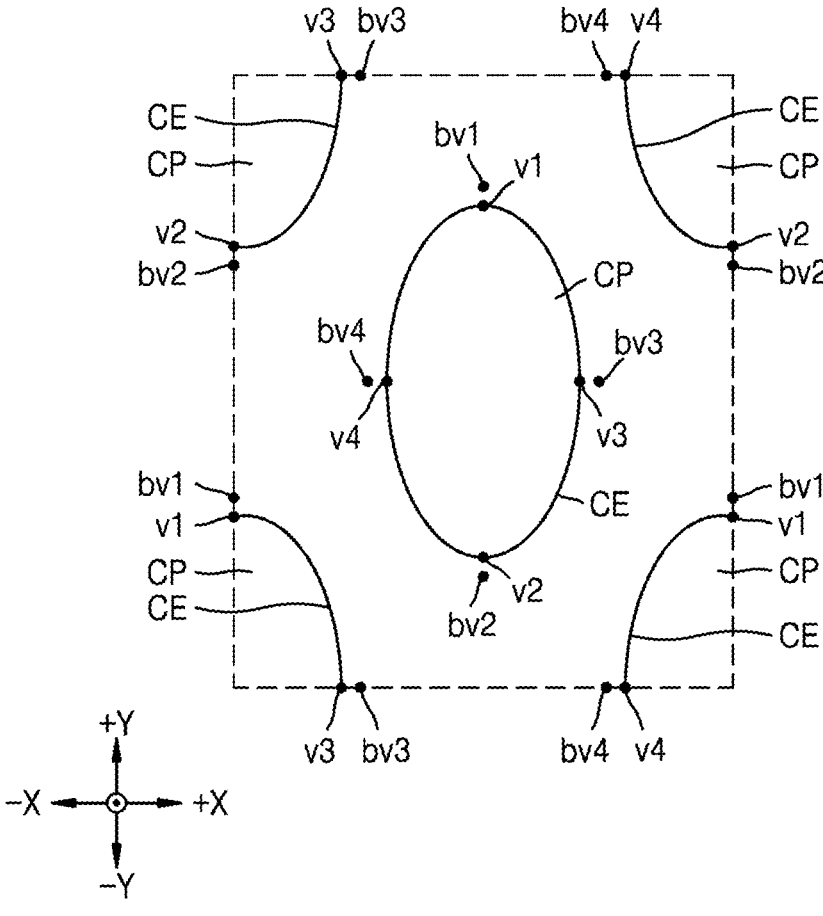
FIGS. 5 and 6 are partial plan views illustrating any one of curve patterns included in the unit cell of FIG. 3 and part of each of the curve patterns surrounding the same.
Figure 6:
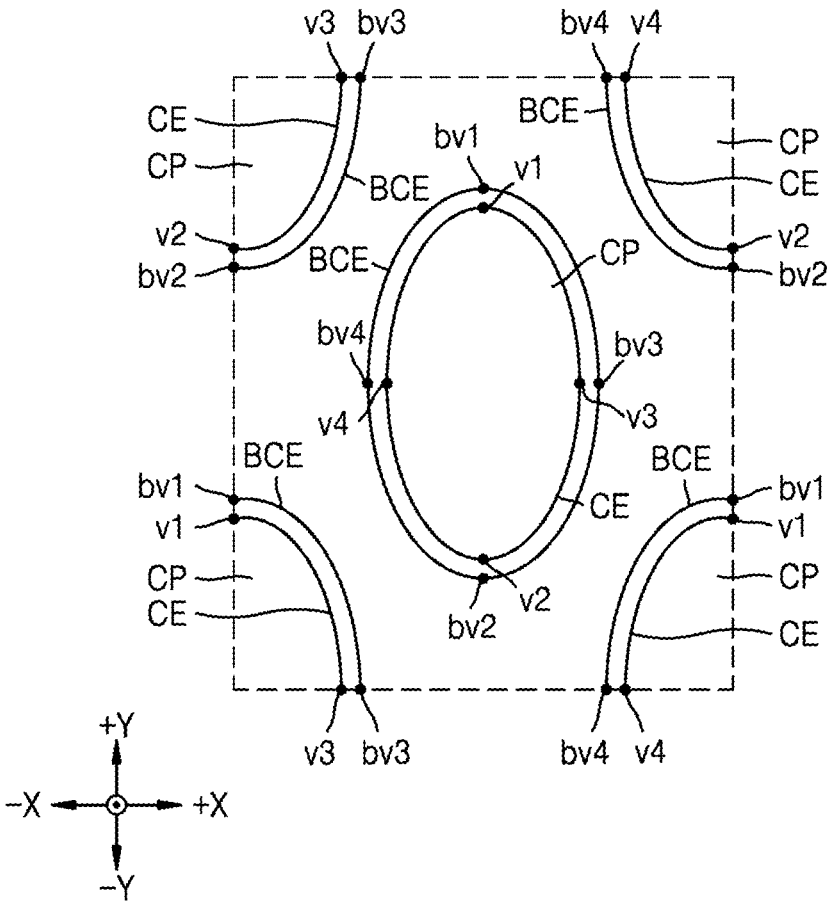

FIGS. 5 and 6 are partial plan views illustrating any one of the curve patterns CP included in the unit cell of FIG. 3 and portions of each of the curve patterns CP surrounding the same. Referring to FIGS. 2, 3, and 5, in operation P45, a bias calculated for any one of the plurality of unit cells UC may be advantageously applied to each of the unit cells UC.

Each of the plurality of curve patterns CP may have a plurality of vertices v1, v2, v3, and v4 and curved edges CE connecting the vertices v1, v2, v3, and v4 to each other. The plurality of vertices v1, v2, v3, and v4 may be endpoints of each of the plurality of curve patterns CP. For example, the vertex v1 may be an endpoint in the +Y direction, the vertex v2 may be an endpoint in the −Y direction, the vertex v3 may be an endpoint in the +X direction, and the vertex v4 may be an endpoint in the −X direction.

FIG. 5 illustrates only four vertices v1, v2, v3, and v4, which are the endpoints in the ±X direction and the endpoints in the ±Y direction, for the sake of convenient description, but many (e.g., more than about 100) vertices may be placed along the curved edges CE. In one example, the curved edges CE may each be a part of an ellipse or a part of a circle. In another example, the curved edges CE may each be a curved line with a certain curvature. When the curved edges CE may each have an elliptical shape, the vertices v1 and v2 may be on the major axis of each of the curved edges CE, and the vertices v3 and v4 may be on the minor axis of each of the curved edges CE.

A plurality of biased vertices bv1, bv2, bv3, and bv4 may be obtained by applying the bias calculated in operation P43 to each of the plurality of vertices v1, v2, v3, and v4. As described above, the bias of the plurality of vertices v1, v2, v3, and v4 may be an amount by which the vertices v1, v2, v3, and v4 are moved to correct systematic errors generated by an exposure process, a mask development process, and a mask etching process. The biased vertex bv1 may be a corrected position of the vertex v1, the biased vertex bv2 may be a corrected position of the vertex v2, the biased vertex bv3 may be a corrected position of the vertex v3, and the biased vertex bv4 may be a corrected position of the vertex v4.

FIGS. 3 to 6 illustrate that model-based MPC for the unit cells are applied to the four vertices v1, v2, v3, and v4 that are endpoints in the ±X direction and the ±Y direction of the elliptical curve patterns CP, but the number of vertices v1, v2, v3, and v4 may be variously changed according to shapes of the curve patterns CP. Those skilled in the art will be able to easily arrive at MPC of patterns including any shape and the number of vertices determined according to any shape, based on the description made herein. Subsequently, referring to FIGS. 2 and 6, in operation P47, the curved edges BCE biased based on the plurality of biased vertices bv1, bv2, bv3, and bv4 may be obtained.

In one example, the biased curved edge BCE may be determined based on curvatures of the curved edges CE before performing MPC. In more detail, a curvature of the curved edge CE connecting the vertex v1 to the vertex v3 may be equal to a curvature of the biased curved edge BCE connecting the biased vertex bv1 to the biased vertex bv3, a curvature of the curved edge CE connecting the vertex v3 to the vertex v2 may be equal to a curvature of the biased curved edge BCE connecting the biased vertex bv3 to the biased vertex bv2, a curvature of the curved edge CE connecting the vertex v2 to the vertex v4 may be equal to a curvature of the biased curved edge BCE connecting the biased vertex bv2 to the biased vertex bv4, and a curvature of the curved edge CE connecting the vertex v4 to the vertex v1 may be equal to a curvature of the biased curved edge BCE connecting the biased vertex bv4 to the biased vertex bv1.

In another example, the biased curved edges BCE may be calculated based on an interpolation operation. The interpolation operation may be performed such that the biased curved edges BCE respectively pass through a plurality of corresponding biased vertices bv1, bv2, bv3, and bv4 and traces the curvatures of the curved edges CE before performing MPC.

In another example, the vertices bv1, bv2, bv3, and bv4 constituting the biased curved edges BCE may be biased from the vertices v1, v2, v3, and v4 of the original curved edges CE in a tangential direction of the original curved edges CE. In the MPC of the related art, a pattern edge is calculated in units of segments to recognize pattern density around the corresponding edge, and thus, a processing time (i.e., a turn-around time) is proportional to a size of a kernel and the number of pattern edges. In this case, when a pattern (e.g., contact) resulting from an ILT has a curved edge (e.g., an ellipse), the number of vertices is increased by about 20 times or more a rectangular pattern having 4 vertices. Accordingly, MPC bias calculation requires more than 20 times the time required generally. According to an experimental example of the related art, it can take several days to perform the MPC; thus, it is practically impossible to apply model-based MPC to a design layout according to the ILT.

According to example embodiments, a processing time of MPC is reduced by applying a bias calculated in the model-based MPC for any one of the plurality of unit cells UC to the vertices v1, v2, v3, and v4 of the curve patterns CP of each of the plurality of unit cells UC. According to the experimental example, it is confirmed that the accuracy of MPC equivalent to the accuracy MPC of the related art may be obtained with a calculation time of ½₀ of the time when performing MPC for the whole MTO design layout MDL.

Figure 7:
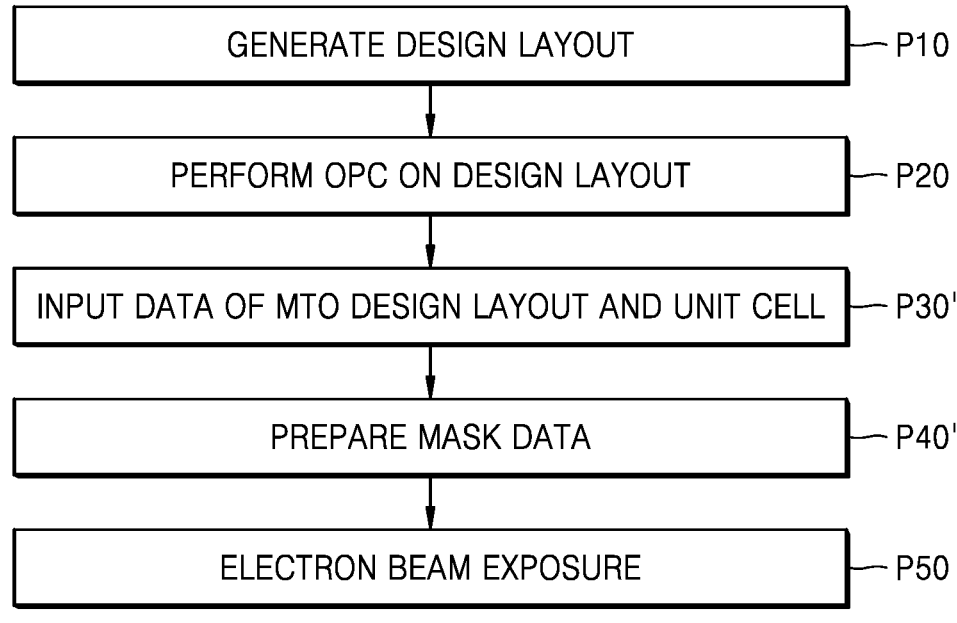
FIG. 7 is a flowchart illustrating a method of fabricating a lithographic mask, according to an example embodiment.

FIG. 7 is a flowchart illustrating a method of fabricating a lithographic mask, according to example embodiments. Because operation P10, operation P20, and operation P50 of FIG. 7 are substantially the same as operations described with reference to FIG. 1, redundant descriptions thereof are omitted. Referring to FIGS. 4 and 7, in operation P30', data of the unit cells UC may be further transmitted together with the MTO design layout. According to example embodiments, each of the unit cells UC may be a unit of design of the MTO design layout. That is, the MTO design layout may include a plurality of repeatedly arranged unit cells UC. For example, the unit cells UC may each be included in a standard cell.

Figure 8:
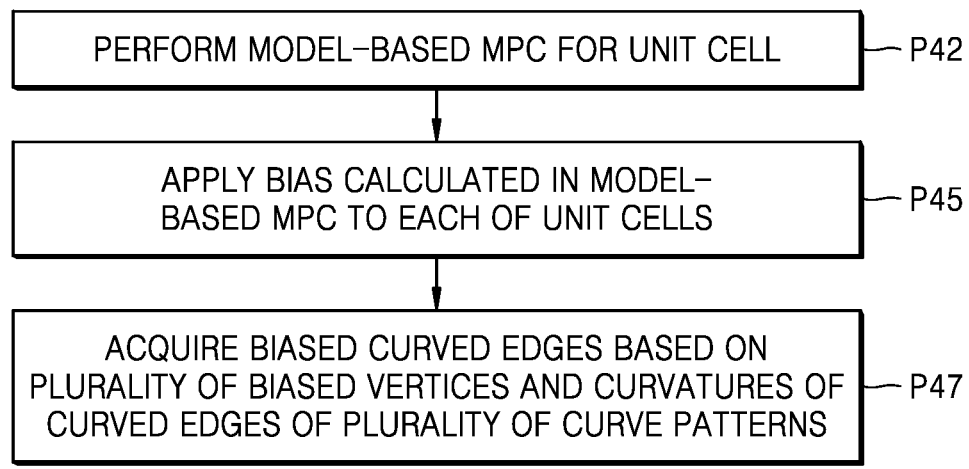
FIG. 8 is a flowchart illustrating MPC included in mask data preparation according to an example embodiment.

FIG. 8 is a flowchart illustrating MPC included in MDP according to example embodiments. The MPC described with reference to FIG. 8 may be included in MDP in operation P40' of FIG. 7. Referring to FIGS. 4 and 8, in operation P42, model-based OPC bias may be determined for the unit cells UC. Unlike the model-based MPC performed on any one of the plurality of unit cells UC included in the MTO design layout during the MPC described above with reference to FIG. 2, model-based MPC may be performed on the unit cell UC provided separately from the MTO design layout in operation P30' according to the present embodiment. A detailed aspect of performing the model-based MPC on the unit cell UC provided separately from the MTO design layout is substantially the same as the aspect described with reference to FIGS. 2 to 4, and thus, redundant descriptions thereof are omitted.

According to example embodiments, in operation P45, the model-based MPC may be performed based on the bias determined in operation P43', and biased curved edges may be obtained in operation P47. The processes of operation P45 and operation P47 are substantially the same as the processes described with reference to FIGS. 2 to 6, and thus, redundant descriptions thereof are omitted.

Figure 9:
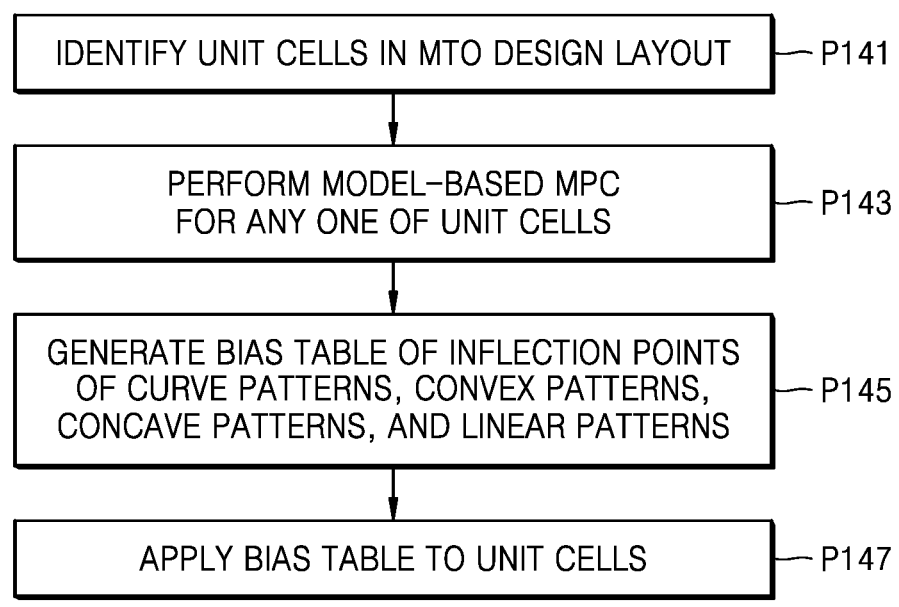
FIG. 9 is a flowchart illustrating an MPC method according to another example embodiment.

FIG. 9 is a flowchart illustrating an MPC method according to other example embodiments. The MPC method described with reference to FIG. 9 may be included in the MDP in operation P40 of FIG. 1 or may be included in the MDP in operation P40' of FIG. 7. Referring to FIG. 9, unit cells included in the MTO design layout may be identified in operation P141.

According to example embodiments, the MTO design layout may be for forming logic integrated devices unlike the examples described above. The logic integrated devices include a microprocessor unit (MPU), a central processing unit (CPU), a graphics processing unit (GPU), a micro controller unit (MCU), a digital signal processor (DSP), a system-on-chip (SOC), and so on. According to example embodiments, unit cells may be repeatedly arranged in MTO design layout, and the unit cells may include curve patterns, convex patterns, concave patterns, and linear patterns.

Subsequently, in operation P143, a bias table of inflection points of curve patterns, convex patterns, concave patterns, and linear patterns may be generated by performing model-based MPC on any one of a plurality of unit cells. Factors of the model-based MPC may include curvature, a duty, and a size. In addition, the bias table generated in operation P143 may be applied to each of the plurality of unit cells in operation P145. The application of the bias table generated in operation P143 may include determining bias of inflection points of curve patterns, convex patterns, concave patterns, and linear patterns of any one of a plurality of unit cells according to the bias table.

Then, in operation P147, biased curve patterns, biased convex patterns, biased concave patterns, and biased linear patterns may be determined based on each of a plurality of biased inflection points, an initial curvature of curve patterns, an initial curvature of convex patterns, an initial curvature of concave patterns, and an initial curvature of linear patterns.

While the inventive concept has been particularly shown and described with reference to embodiments thereof, it will be understood that various changes in form and details may be made therein without departing from the spirit and scope of the following claims.

What is claimed is:

1. A method, comprising:
performing mask process correction (MPC) on a mask tape out (MTO) design layout, said MPC including: (i) identifying a plurality of unit cells, each being iterated in the MTO design layout and the plurality of unit cells including a plurality of curve patterns, convex patterns, concave patterns, and linear patterns, and (ii) performing model-based MPC on each of the plurality of unit cells;
wherein the plurality of curve patterns are arranged to constitute rows and columns, and a curved edge of each of the plurality of curve patterns has an elliptical shape;
wherein performing MPC further includes applying a single bias for to the plurality of curve patterns with the elliptical shape calculated based on one of the plurality of unit cells, to each of the plurality of unit cells;
wherein each of the plurality of curve patterns with the elliptical shape includes first and second vertices on a major axis of the curved edge, and third and fourth vertices on a minor axis of the curved edge;
wherein applying the single bias includes applying the single bias to the first to fourth vertices to determine first to fourth biased vertices, which are respectively corrected positions of the first to fourth vertices in order for a respective biased curve pattern that is constrained to have matching curvature relative to the curved edges of a corresponding curve pattern with the elliptical shape during said applying the single bias, and
wherein the method further comprises:
fabricating a lithographic mask by performing electron beam exposure based on the MTO design layout having only the single bias.

2. The method of claim 1, wherein said performing model-based MPC on each of the plurality of unit cells is based on at least one of an aspect ratio, sizes, curvatures of curved edges, density, and a duty of the plurality of curve patterns.

3. The method of claim 1, wherein said performing MPC further comprises determining biased curved edges by modifying the plurality of curve patterns with the elliptical shape based on the first to fourth biased vertices.

4. The method of claim 3, wherein the determining of the biased curved edges is based on curvatures of the plurality of curve patterns with the elliptical shape, before performing MPC.

5. The method of claim 1, wherein the MTO design layout is generated by inverse lithography technology (ILT).

6. The method of claim 1, wherein the plurality of curve patterns with the elliptical shape correspond to contacts formed on a wafer.

7. A method, comprising:

performing mask process correction (MPC) on a mask tape out (MTO) design layout, said MPC including: (i) identifying a plurality of unit cells, each being iterated in the MTO design layout and including curve patterns, convex patterns, concave patterns, and linear patterns, and (ii) performing model-based MPC on a first one of the plurality of unit cells;

wherein performing MPC further includes applying a single bias to each of the plurality of curve patterns associated with the first one of the plurality of unit cells;

wherein each of the plurality of curve patterns includes a respective pair of first and second vertices on a curved edge of a corresponding curve pattern;

wherein applying the single bias includes applying the single bias to at least one of the pairs of first and second vertices to determine a corresponding pair of first and second biased vertices, which are corrected positions of the corresponding first and second vertices on a respective biased curve edge of a biased curve pattern that is constrained to have matching curvature relative to the curved edge of the corresponding curve pattern during said applying the single bias, and wherein the method further comprises:

fabricating a lithographic mask by performing electron beam exposure based on the MTO design layout having only the single bias.

8. The method of claim 7, wherein a factor of the model-based MPC includes a curvature, a duty, and a size of each of the curve patterns, the convex patterns, the concave patterns, and the linear patterns.

9. The method of claim 7, wherein, in the performing of the MPC, a bias table for inflection points of each of the curve patterns, the convex patterns, the concave patterns, and the linear patterns is generated based on the model-based MPC for any one of the plurality of unit cells.

10. The method of claim 9, wherein said performing MPC further comprises determining biased inflection points by applying the bias table to the inflection points of each of the curve patterns, the convex patterns, the concave patterns, and the linear patterns of each of the plurality of unit cells.

11. The method of claim 10, wherein said performing MPC further comprises correcting the curve patterns, the convex patterns, the concave patterns, and the linear patterns of each of the plurality of unit cells based on the biased inflection points and curvatures of the curve patterns, the convex patterns, the concave patterns, and the linear patterns.

12. A method, comprising:

performing mask process correction (MPC) on a mask tape out (MTO) design layout, said MPC including: (i) identifying at least one unit cell containing a plurality of curve patterns, convex patterns, concave patterns, and linear patterns, therein, and (ii) performing model-based MPC on the identified at least one unit cell;

wherein performing MPC further includes applying a single bias to each of the plurality of curve patterns associated with the at least one unit cell;

wherein each of the plurality of curve patterns includes a respective pair of first and second vertices on a curved edge of a corresponding curve pattern; and wherein applying the single bias includes applying the single bias to at least one of the pairs of first and second vertices to determine a corresponding pair of first and second biased vertices, which are corrected positions of the corresponding first and second vertices on a respective biased curve edge of a biased curve pattern that is constrained to have matching curvature relative to the curved edge of the corresponding curve pattern during said applying the single bias, and wherein the method further comprises:

fabricating a lithographic mask by performing electron beam exposure based on the MTO design layout having only the single bias.

13. The method of claim 12, wherein the biased curve edge of the biased curve pattern is determined using an interpolation operation.

* * * * *